United States Patent
Chung et al.

(10) Patent No.: US 7,056,828 B2
(45) Date of Patent: Jun. 6, 2006

(54) SIDEWALL SPACER STRUCTURE FOR SELF-ALIGNED CONTACT AND METHOD FOR FORMING THE SAME

(75) Inventors: Tae-Young Chung, Kyungki-do (KR); Jae-Goo Lee, Seoul (KR); Dong-Jun Lee, Kyungki-do (KR)

(73) Assignee: Samsung Electronics Co., Ltd, Suwon-si (KR)

( * ) Notice: Subject to any disclaimer, the term of this patent is extended or adjusted under 35 U.S.C. 154(b) by 29 days.

(21) Appl. No.: 10/404,951

(22) Filed: Mar. 31, 2003

(65) Prior Publication Data

US 2004/0188806 A1 Sep. 30, 2004

(51) Int. Cl.
*H01L 24/4763* (2006.01)

(52) U.S. Cl. ............... 438/639; 257/774; 438/637; 438/640

(58) Field of Classification Search ............ 257/773, 257/774; 438/233, 637, 639, 640
See application file for complete search history.

(56) References Cited

U.S. PATENT DOCUMENTS

| | | | |
|---|---|---|---|
| 6,033,981 A * | 3/2000 | Lee et al. ............. | 438/624 |
| 6,194,302 B1 | 2/2001 | Shen ..................... | 438/597 |
| 6,245,625 B1 * | 6/2001 | Gau ...................... | 438/305 |
| 6,335,279 B1 * | 1/2002 | Jung et al. ............. | 438/666 |
| 6,372,575 B1 | 4/2002 | Lee et al. .............. | 438/253 |
| 6,380,042 B1 | 4/2002 | Huang .................. | 438/303 |
| 6,495,889 B1 * | 12/2002 | Takahashi ............. | 257/382 |
| 6,764,893 B1 * | 7/2004 | Lee et al. .............. | 438/233 |
| 2001/0045666 A1 * | 11/2001 | Kim et al. ............. | 257/774 |
| 2003/0036291 A1 * | 2/2003 | Hong et al. ............ | 438/778 |
| 2004/0014278 A1 * | 1/2004 | Lee et al. .............. | 438/239 |
| 2004/0077145 A1 * | 4/2004 | Inoue ................... | 438/257 |
| 2004/0119170 A1 * | 6/2004 | Kim et al. ............. | 257/775 |

FOREIGN PATENT DOCUMENTS

| | | |
|---|---|---|
| DE | 10107125 A1 | 9/2001 |
| GB | 2366076 A | 2/2002 |
| KR | 2002-88980 | 11/2002 |

OTHER PUBLICATIONS

Jaegoo Lee, et al. "A Novel DRAM Technology using Dual Spacer and Mechanically Robust Capacitor for 0.12μm DRAM and beyond" 31$^{st}$ European solid-state device research conference, Nov. 2001 (4 pages).
English language abstract of Korean Publication No. 2002-88980.
English language abstract of German Publication No. DE 10107125 A1.

* cited by examiner

*Primary Examiner*—Allan R. Wilson
(74) *Attorney, Agent, or Firm*—Marger Johnson & McCollom, P.C.

(57) ABSTRACT

In one embodiment, adjacent conductive patterns are formed overlying a semiconductor substrate. The conductive patterns each have a conductive line and a capping layer. A first spacer formation layer is formed between the adjacent conductive patterns. The first spacer formation layer is formed between the top surface of the capping layer and the bottom surface of the conductive line. A conformal second spacer formation layer is formed on the conductive patterns. A first interlayer insulating layer is formed on the conformal second spacer formation layer. Next, an opening is formed to extend to a portion of the first spacer formation layer, in the first interlayer insulating layer. The portion of the first spacer formation layer is etched, using the second spacer formation layer as an etch mask, to form a single-layer spacer on sidewalls of the conductive patterns, concurrently with a contact hole.

24 Claims, 8 Drawing Sheets

SIDEWALL SPACER STRUCTURE FOR SELF-ALIGNED CONTACT AND METHOD FOR FORMING THE SAME

BACKGROUND OF THE INVENTION

1. Field of the Invention

The present invention relates to semiconductor devices and, more particularly, to a spacer structure for Self-Aligned Contact (SAC) applications and to a method for forming the same.

2. Description of the Related Art

As semiconductor devices become more highly integrated, it becomes increasingly more difficult to secure adequate misalignment margins during a fabrication process. This is due in part to limitations in photolithography and etching techniques. For example, as the spacing between a node contact of the capacitor and its neighboring bit lines decreases, it becomes more difficult to form a contact hole between the bit lines without causing problems such as electrical shorts.

Figure 1A:
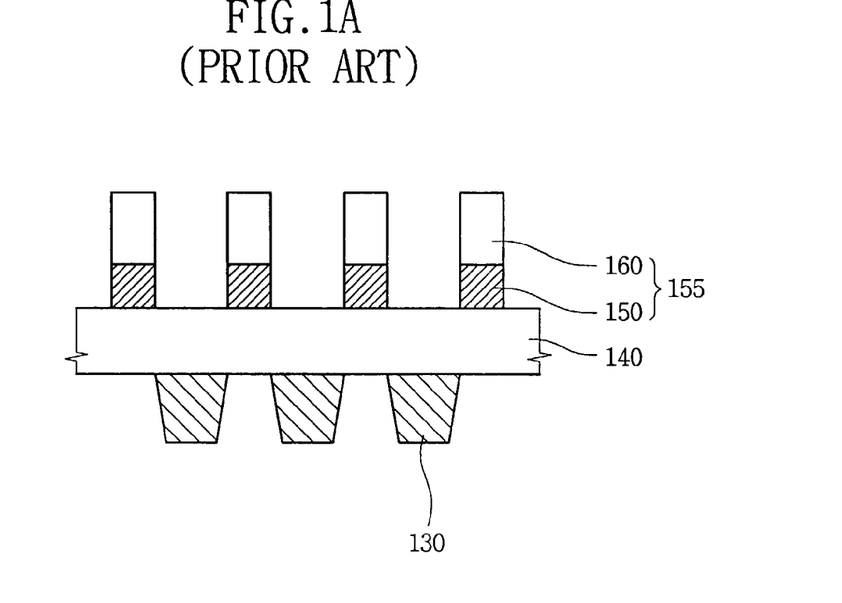
FIGS. 1A to 1E are cross-sectional views illustrating steps of a method for forming a self-aligned storage node contact according to the prior art.

Various attempts have been made in the industry, such as utilizing a Self-Aligned Contact (SAC) process, to deal with these problems. FIGS. 1A to 1E are cross-sectional views illustrating a process of forming a storage node contact using a conventional SAC process. Referring to FIG. 1A, a first interlayer insulating layer (not shown), having a storage node contact pad 130, is formed over a semiconductor substrate (not shown). A second interlayer insulating layer 140 is formed on the first interlayer insulating layer. Next, bit line stacks 155 each comprising a bit line 150 and a capping layer 160 are formed on the second interlayer insulating layer 140.

Figure 1B:
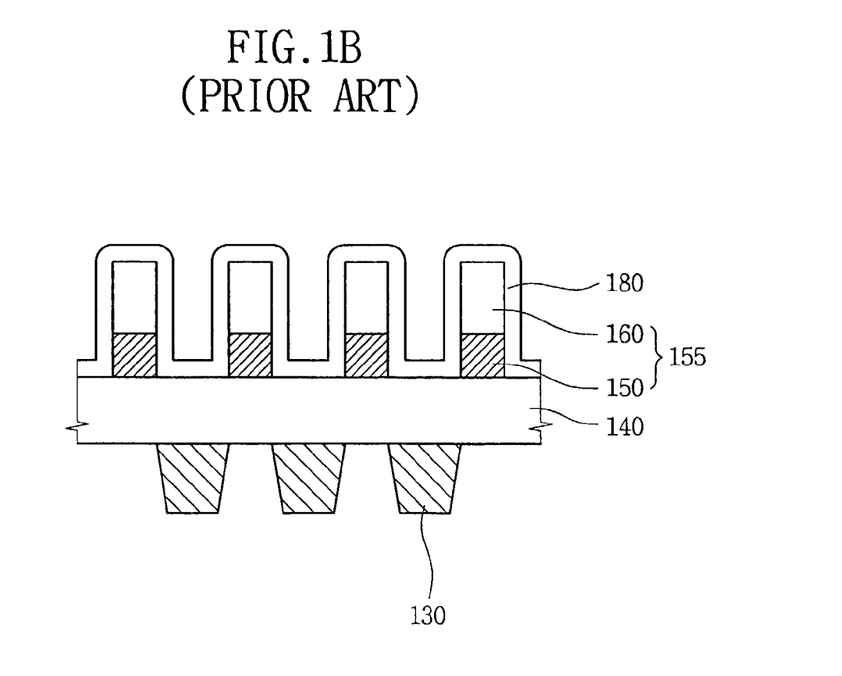
Figure 1C:
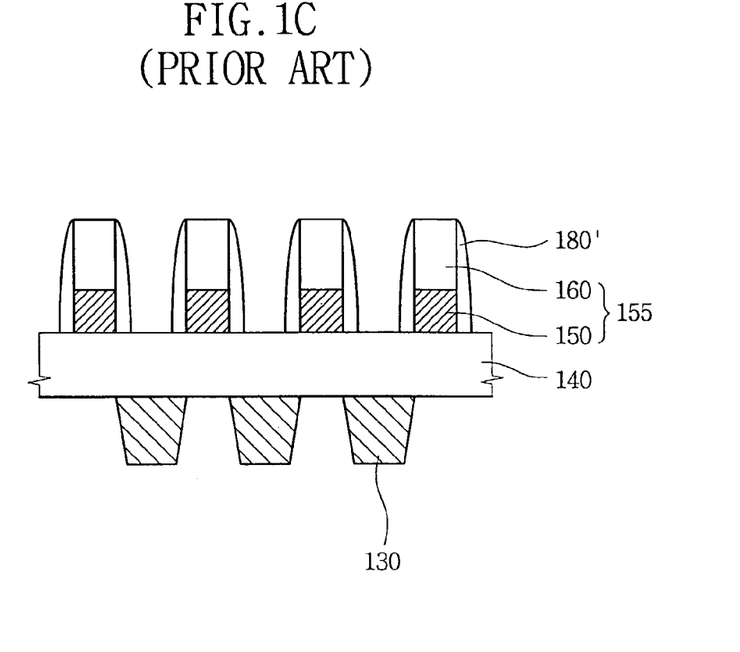
Figure 1D:
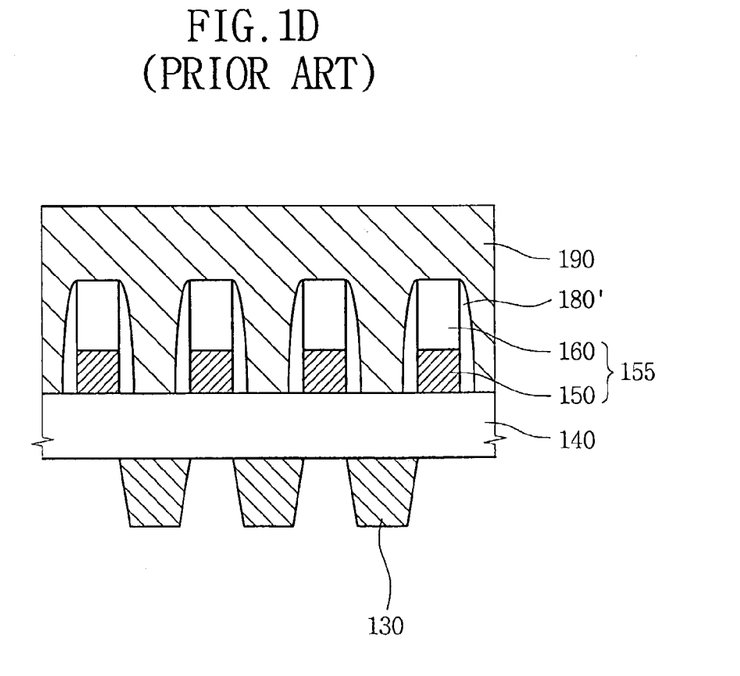
Figure 1E:
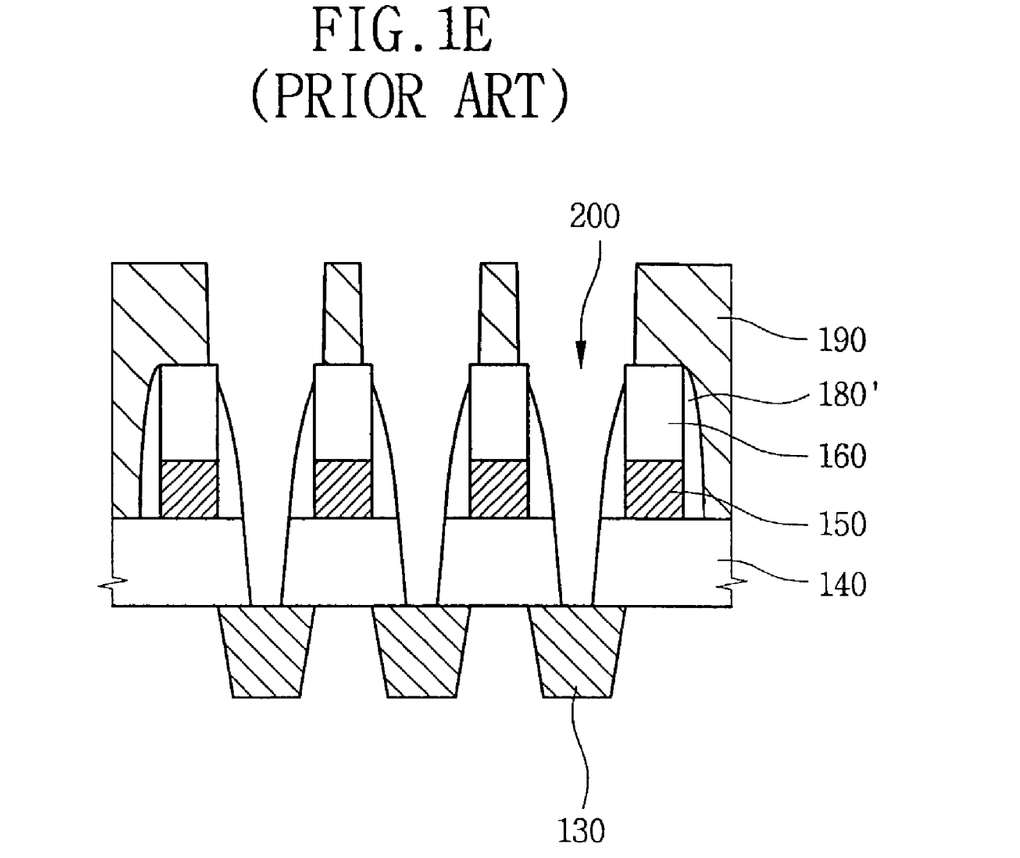

Referring to FIG. 1B, a silicon nitride layer 180 is formed on the bit line stacks 155 and on the second interlayer insulating layer 140. The silicon nitride layer 180 is subsequently etched back, as shown in FIG. 1C, to form a single-layer sidewall spacer 180'. Referring to FIG. 1D, after forming the single-layer spacer 180', a third interlayer insulating layer 190 is formed on the bit line stacks 155, which include the etched-back single-layer spacer 180', and on the second interlayer insulating layer 140. Referring to FIG. 1E, the third interlayer insulating layer 190 is then patterned using the etched-back single-layer spacer 180' as the etch stopper to define a conventional self-aligned storage node contact hole 200.

Unfortunately, however, there are numerous drawbacks with the conventional SAC process, for example, represented in FIGS. 1A–1E. For example, the sidewall spacer 180' may be over-eroded (thinned) by etching chemicals during the etching back process in which the single-layer spacer 180' is formed and also during the etching process in which the contact hole 200 is formed. Over-erosion leads to shoulder over-etching and/or shoulder weakness, which, in turn, leads to electrical shorts along the bit line 150 and the storage node contact pad 130. The term "shoulder" herein refers to the thinnest portions of the sidewall spacer 180' exposed by the contact hole 200. In addition, because the single-layer spacer 180' may be over-etched during the formation of the contact hole 200, the thickness of the single-layer spacer 180' may become very thin. This increases the bit line loading capacitance, thereby preventing further integration of the memory devices.

Furthermore, as part of the trend toward higher integration densities, a height of contact holes is increasing while an aperture of the contact holes is decreasing, thereby resulting in an increased aspect ratio (ratio of height to width). It is therefore difficult to completely fill the deep and narrow contact hole, resulting in a void in the interlayer dielectric layer between the conductive lines (e.g., bit lines). This void may be extended during cleaning (e.g., during wet cleaning processes), resulting in a bridge between the bit lines 155 and/or adjacent contact pads 130 that can cause short circuits.

Accordingly, there is a need for an improved semiconductor fabrication process that can increase an etch margin or shoulder width and can reduce the bit line loading capacitance, while further minimizing shoulder loss.

SUMMARY

The present invention provides, among other things, a semiconductor device that has more reliable self-aligned storage node contacts and a method for forming the same without the problems noted above.

In one embodiment, adjacent conductive patterns are formed overlying a semiconductor substrate. The conductive patterns each have a conductive line and a capping layer. A first spacer formation layer is formed between the adjacent conductive patterns. The first spacer formation layer is formed between the top surface of the capping layer and the bottom surface of the conductive line. A second spacer formation layer is conformally formed on the conductive patterns. A first interlayer insulating layer is formed on the second spacer formation layer. An opening is formed, in the first interlayer insulating layer, extending to a portion of the first spacer formation layer. The portion of the first spacer formation layer is etched, using the second spacer formation layer as an etch mask, to form a single-layer spacer on sidewalls of the conductive patterns, concurrently with a contact hole.

BRIEF DESCRIPTION OF THE DRAWINGS

The foregoing and other objects, features, and advantages of the invention will become more readily apparent from the following detailed description of a preferred embodiment that proceeds with reference to the following drawings.

DETAIL DESCRIPTION

Various embodiments of the present invention will be described in detail in the following description, to provide a more thorough understanding of the present invention. It should be understood, however, that those of ordinary skill in the art will recognize that the invention can be practiced in various alternative forms. It should be further noted that various well-known structures and techniques may not be shown and described in detail herein to avoid unnecessarily obscuring the principles of the present invention.

Figure 2A:
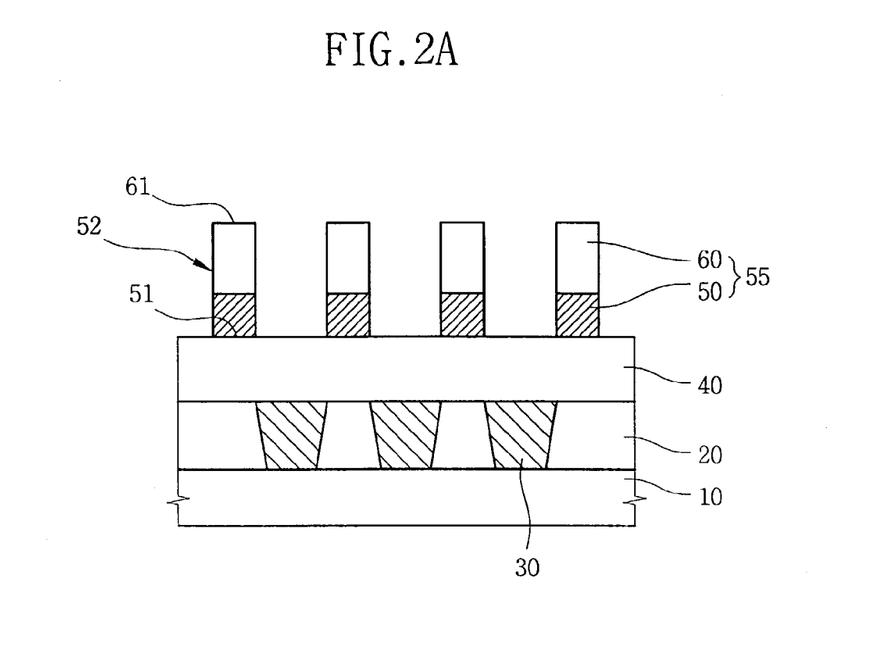
FIGS. 2A to 2F are cross-sectional views showing a self-aligned storage node contact along the directions A–A', B–B', according to an embodiment of the present invention.

FIG. 2A to 2F illustrate a self-aligned storage node contact process according to one embodiment of the present invention. Referring first to FIG. 2A, a first interlayer insulating layer 20 is preferably formed to a thickness of about 1000–3000 angstroms on a semiconductor substrate 10 using conventional techniques (e.g., a low-pressure chemical vapor deposition (LP-CVD) process or a high density plasma chemical vapor deposition (HDP-CVD) process).

Other suitable dielectric materials such as a borophosphosilicate glass (BPSG), spin-on-glass (SOG), plasma-enhanced tetraethylorthosilicate (PE-TEOS) oxide, undoped silicate glass (USG), could also be used to form the first interlayer insulating layer 20.

A second interlayer insulating layer 40 is subsequently formed on the storage node contact pad 30 and on the first interlayer insulating layer 20. The thickness of the second interlayer insulating layer 40 is preferably in a range of between about 1000 and 3000 angstroms. The second interlayer insulating layer 40 is preferably planarized using planarizing techniques such as chemical mechanical polishing (CMP), for example, to improve photolithography process margins. After the planarizing process, the second interlayer insulating layer 40 is preferably about 2000 angstroms thick.

Conductive patterns 55 having sidewalls 52 are formed over the semiconductor substrate 10. The conductive patterns 55 each comprise a conductive line such as a bit line 50 and a capping layer 60 (e.g., a patterned bit line mask layer). The bit line 50 is preferably formed of a conductive material such as tungsten to a thickness of about 400–800 angstrom. The capping layer 60 is preferably formed of silicon nitride to a thickness of about 1000–3000 angstroms. The capping layer 60 could, however, be formed of other suitable insulating materials.

Figure 2B:
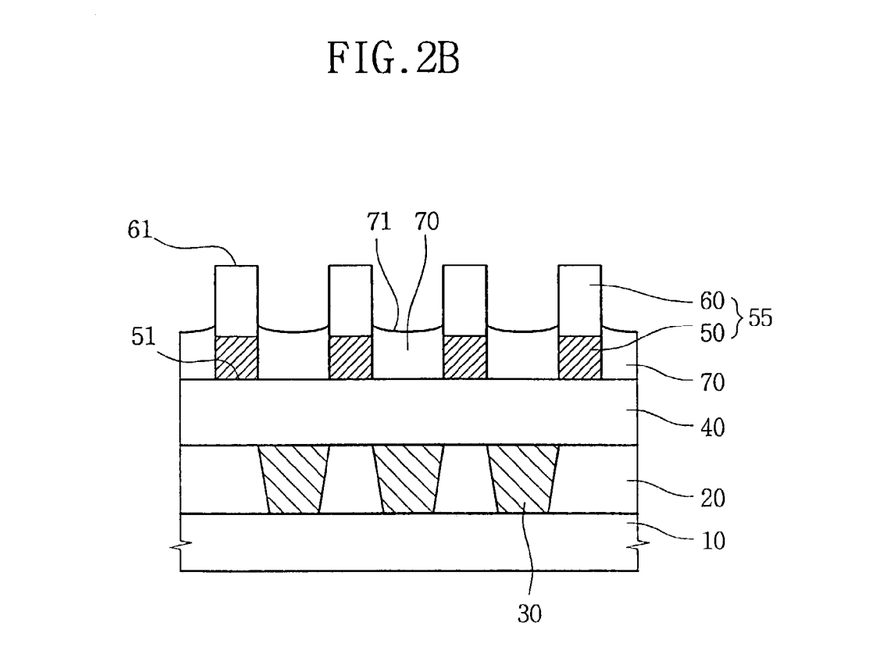

Turning to FIG. 2B, a first spacer formation layer 70 is preferably formed on the second interlayer insulating layer 40 between the conductive patterns 55. The first spacer formation layer 70 can be formed, for example, of LP-CVD oxide, BPSG, HDP-CVD oxide, or CVD oxide, having a relatively low permittivity or dielectric constant. Other suitable low-dielectric-constant materials could also be used.

Consequently, the top surface of the first spacer formation layer 70 is formed between the top surface 61 of the capping layer 60 and the bottom surface 51 of the bit line 50. The top surface 71 of the first spacer formation layer 70 is preferably arranged substantially below the top surface 61 of the capping layer 60, or 100–2000 angstroms above the top surface 51 of the bit line 50. Alternatively, the top surface 71 of the first spacer formation layer 70 can be arranged approximately midway between the top surface 61 of the capping layer 60 and the bottom surface 51 of the bit line 50.

Figure 2C:
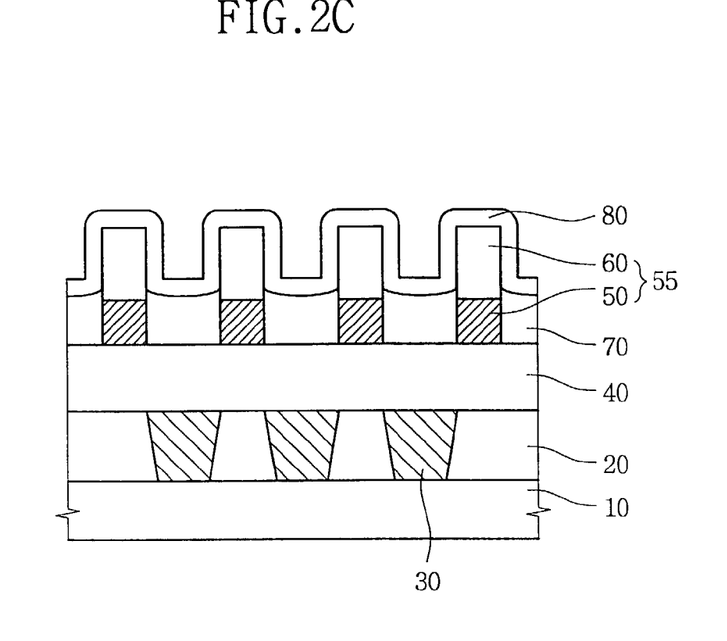

Referring now to FIG. 2C, a conformal second spacer formation layer 80 can be formed on the conductive patterns 55 using a conventional technique such as an LP-CVD process. The second spacer formation layer 80 is preferably formed of a material having an etch selectivity with respect to the material (e.g., silicon dioxide) forming the first spacer formation layer 70. The first spacer formation layer 70 preferably has a lower dielectric constant (low permittivity) than the second spacer formation layer 80. The second spacer formation layer 80 may be formed, for example, of silicon nitride, to a thickness of about 200–600 angstroms. Those skilled in the art will appreciate that other suitable materials with proper etching rates and dielectric constants can be used and still fall within the spirit and scope of the present invention.

Figure 2D:
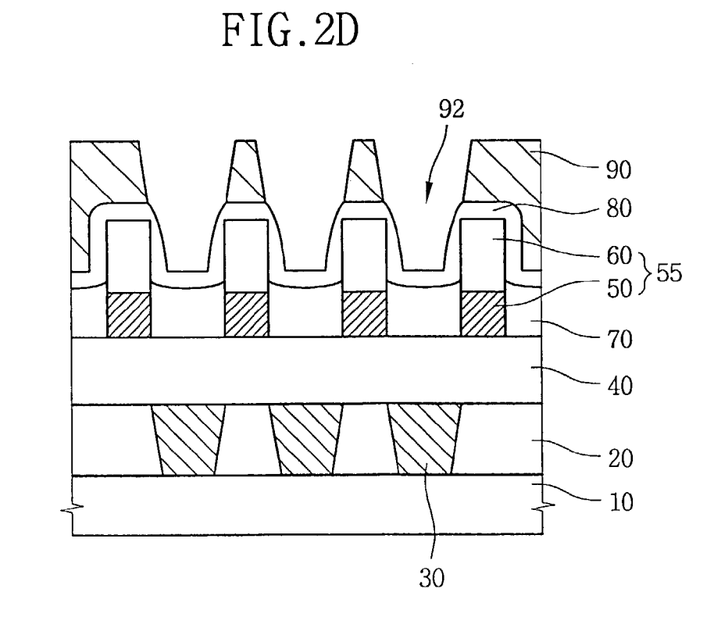

Turning to FIG. 2D, a third interlayer insulating layer 90 can be formed on the conformal second spacer formation layer 80 using a conventional technique, such as an LP CVD or HDP CVD process, for example. The third interlayer insulating layer 90 preferably has an etch selectivity with respect to the second spacer formation layer 80. The third interlayer insulating layer 90 is preferably formed of a material similar to the first spacer formation layer 70. The third interlayer insulating layer 90 can be planarized using conventional planarizing techniques. Subsequently, an opening 92 is formed in the third interlayer insulating layer 90 using the second spacer formation layer 80 (See FIG. 3C) as an etch stopper, exposing a portion of the second spacer formation layer 80. The opening 92 is formed between adjacent conductive patterns 55 and is self-aligned with the second spacer formation layer 80.

Figure 2E:
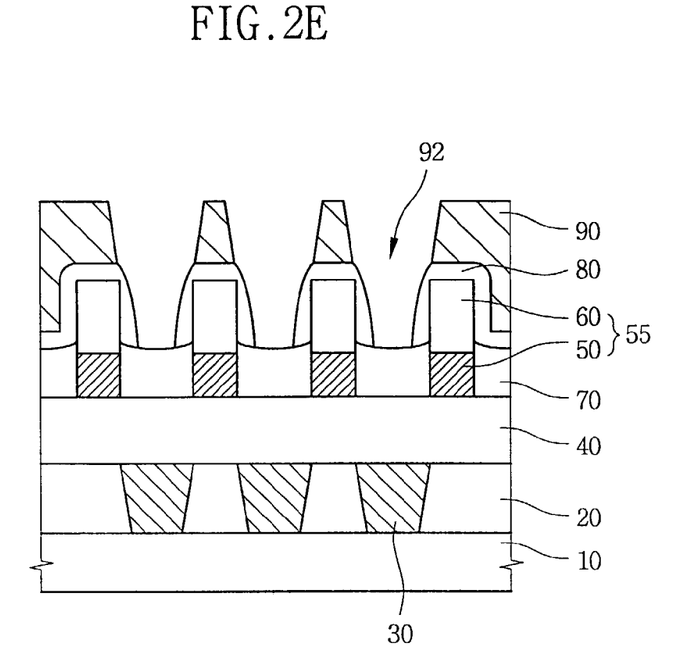

Referring to FIG. 2E, a portion of the exposed second spacer formation 80 can be preferably etched or removed to expose a portion of the first spacer formation layer 70 (the opening 92 is extended to a portion of the first spacer formation layer 70), according to an embodiment of the present invention.

Figure 2F:
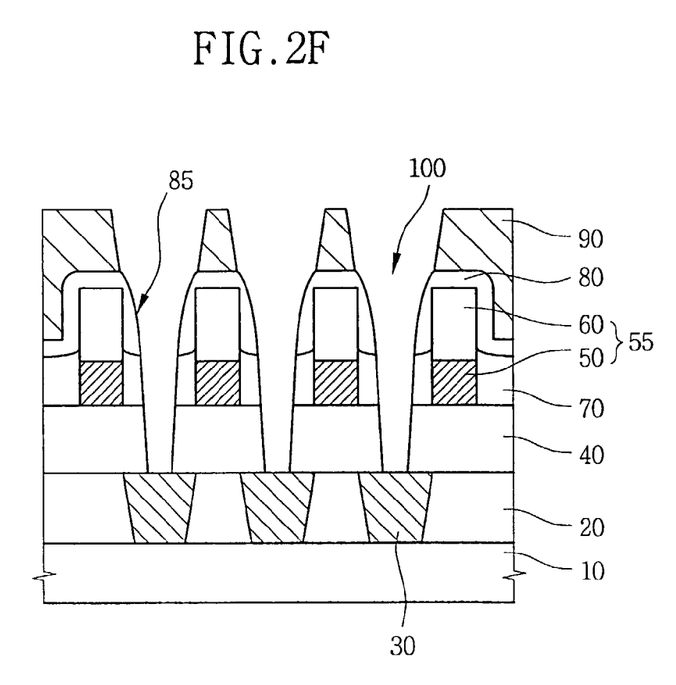

Turning to FIG. 2F, a storage node contact hole 100 can also be formed in the first spacer formation layer 70 and the second interlayer insulating layer 40. The storage node contact hole 100 can be formed by etching the first spacer formation layer 70 and the second interlayer insulating layer 40 using the second spacer formation layer 80 (having un-etched top flat portions) as an etch mask. The storage node contact hole 100 extends through the second interlayer insulating layer 40 to expose a portion of the contact pad 30.

During this process, a single-layer spacer 85 is formed because the exposed portion of the first spacer formation layer 70 is also etched using the second spacer formation layer 80 as an etch mask. The term "single-layer" refers to the fact that the layer forming a sidewall spacer on the sidewall of the conductive patterns 55 is a single layer, which does not have additional layers stacked thereon. The storage node contact hole 100 is preferably self-aligned with the single-layer spacer 85, and arranged between the adjacent conductive patterns 55. Accordingly, the single-layer spacer 85 is formed concurrently with the storage node contact hole 100.

In the prior art described previously, the SAC etch process begins with the already etched-back spacer 180'. See FIGS. 1D–1E. In other words, the silicon nitride layer 180 is etched-back to form a bit line spacer 180' having no un-etched flat portions, before forming the third insulation layer 190 thereon and before performing the SAC contact hole formation process. It has therefore not been easy to obtain sufficient shoulder width or etch margins during the SAC etch process. The bit line spacer 180 in the prior art is therefore prone to more spacer loss, which can lead to accidental shorts, for example, between the bit lines 150 and contact pads 130.

In contrast, unlike the prior art and according to the foregoing embodiment of the present invention, the SAC etch process begins before forming the single-layer spacer 85. See FIGS. 2C–2D. In other words, the SAC etch process starts with portions (e.g., a top portion) of the second spacer formation layer 80 left un-etched and therefore having flatter areas on top thereof and thicker edge portions than the prior art. The second spacer formation layer 80 is first exposed during the process of forming the storage node contact hole 100 and the SAC etch is performed on the structure having an un-etched top flat portion. For this reason, loss of the spacer (e.g., decreasing shoulder) can be substantially reduced. The single-layer spacer 85 therefore does not suffer from unacceptable loss or erosion thereof. Accidental shorts between the conductive patterns 55 and contact pads 30 can thereby be prevented by the increased etch margin or shoulder.

In another embodiment (as in the case of line type contact), during the process corresponding to FIG. 2D, the top of the second spacer formation layer 80 can be etched more but still has thicker edge portions than the prior art. As in the previous embodiment, the SAC etch still begins before forming the spacer and after forming the third interlayer insulating layer 90 overlying the second spacer formation layer 80. In this case, the single-layer spacer 85 is also formed concurrently with the formation of the storage node contact hole 100.

A contact plug (not shown) is subsequently formed within the storage node contact hole 100 and is electrically connected to the contact pad 30 using methods known in the art. For example, a metal such as tungsten may be deposited into the storage node contact hole 100. Following the deposition, a planarization step, which may include CMP, can be performed.

Figure 3A:
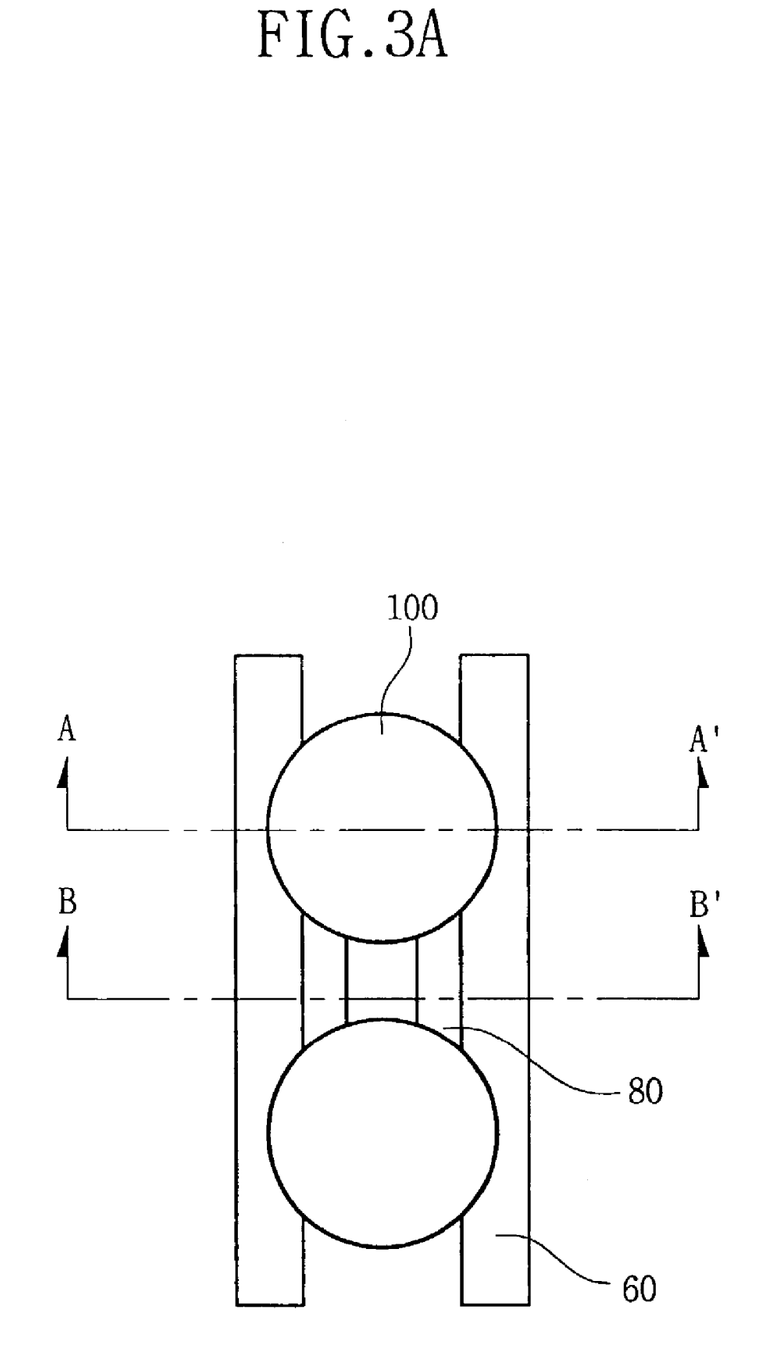
FIG. 3A is a plan view showing a self-aligned storage node contact.
Figure 3B:
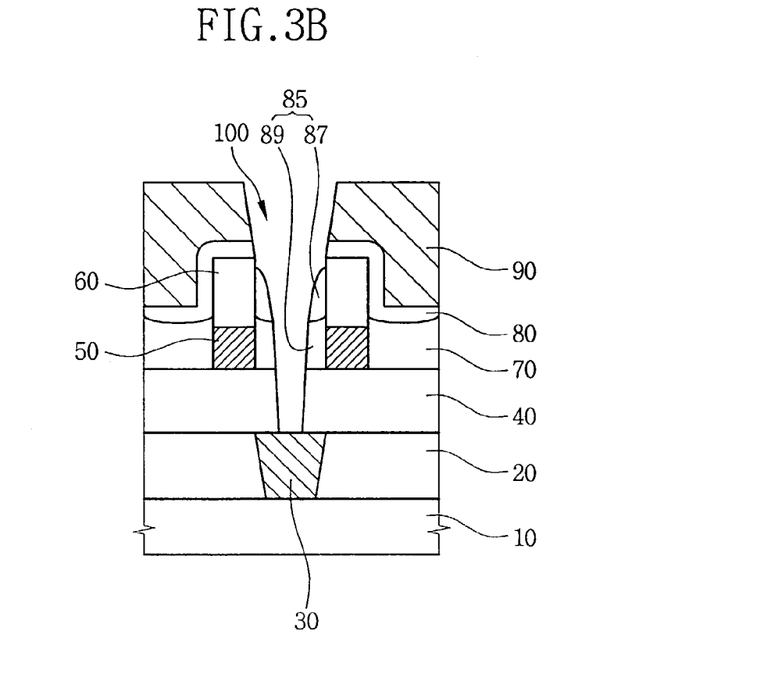
FIGS. 3B to 3C are cross-sectional views showing a self-aligned storage node contact along the directions A–A', B–B' of FIG. 3A, according to an embodiment of the present invention.
Figure 3C:
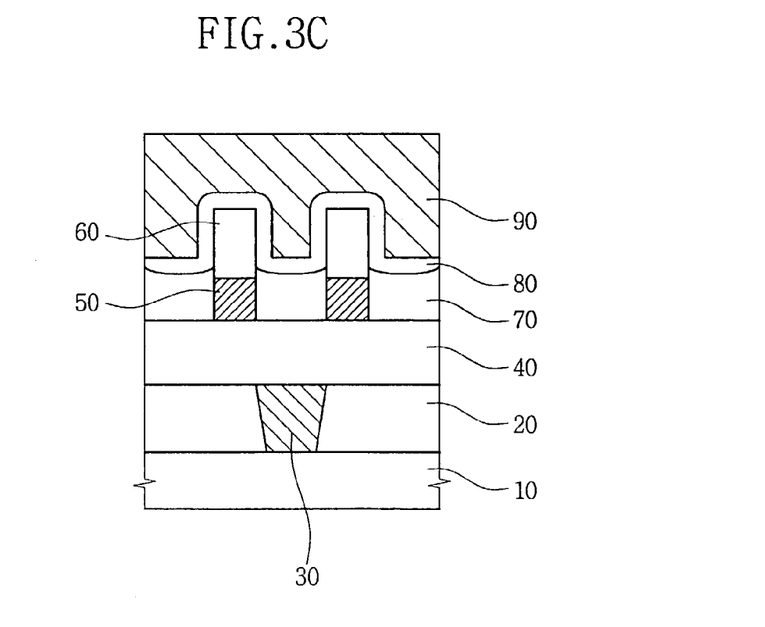

FIG. 3A is a plan view of a self-aligned storage node contact hole 100. FIG. 3B is a sectional view of the self-aligned storage node contact hole 100, taken along the line A–A' of FIG. 3A. FIG. 3C is a cross-sectional view of the area taken along line B–B' of FIG. 3A.

Referring to FIG. 3B, the single-layer spacer 85 formed according to the processes described above can include an upper portion 87 and a lower portion 89. The upper portion 87 preferably comprises a different material from the lower portion 89. This is because lower portion 89 is preferably formed from the first spacer formation layer 70 that includes, for example, silicon dioxide; and the upper portion 87 is preferably formed from the second spacer formation layer 80 that comprises, for example, silicon nitride.

Accordingly, conductive line (loading) parasitic capacitance (e.g., bit line parasitic capacitance) can be substantially reduced (e.g., by more than 25%) by combing layers of relatively low permittivity dielectric material (e.g., silicon dioxide) and relatively high-permittivity dielectric material (e.g., silicon nitride) as opposed to forming the spacer of the high permittivity silicon nitride alone. Accordingly, more cells can be added for each bit line to improve cell array efficiency, thereby increasing the yield and lowering manufacturing costs.

Thus, as shown in FIG. 3B, as a result of the process described above, the single-layer spacer 85 is formed in an area where the storage node contact hole 100 is formed. In contrast, as shown in FIG. 3C, in the area that the line B–B' extends through, however, there are only un-etched layers (no single-layer spacer is formed). This is because the single-layer spacer 85 is formed when and where the storage node contact hole 100 is formed.

If this process is performed in semiconductor devices, a non-cell area (not separately illustrated), therefore, would not include a single-layer spacer like the structure shown in FIG. 3C, while a cell area would include a single-layer spacer 85 as explained above (FIG. 3B). The term "non-cell area" refers to an area of the semiconductor device that is not a memory cell, e.g., a peripheral circuit area, a core circuit area or both.

Although this invention has been described above primarily with reference to forming a spacer on sidewalls of bit lines, the principles of the present invention can also be applied to other sidewall spacer structures such as for gate electrodes. The principles of the present invention can also be applied to various type of semiconductor devices including memory devices such as DRAMs, SRAMs, and embedded memories. Furthermore, the principles of the present invention can be applied to various types of contacts such as line-type contacts. Such line-type contacts can be formed by, for example, forming a mask pattern having a line-type groove crossing the bit line at right angles on an interlayer dielectric layer. A line-type contact hole is formed in the interlayer dielectric layer using the methods described above. The line-type contact hole extends in a direction perpendicular to the bit line. Then, a conductive material is formed in the line-type contact hole. The resulting structure is subsequently planarized to form individual storage node contact pads.

In summary, the disclosed embodiments enable formation of a highly reliable SAC structure. For example, with the embodiments of the present invention, it is possible to reduce shoulder erosion (e.g., spacer loss or capping layer loss), thereby increasing misalignment or process margins. It is also possible to reduce bit-line loading capacitance. Furthermore, because the first spacer formation layer 70 is formed between the conductive patterns 55 and on the second interlayer insulating layer 40 before forming the third interlayer insulating layer 90, the gap fill margin is improved and the aspect ratio can be substantially reduced (e.g., 4:1 to 2.5:1). Undesirable shorts between the contact pads can therefore be avoided.

Consequently, the reliability of the semiconductor device is significantly improved. Correspondingly, yield is improved and the manufacturing costs are reduced.

Having described and illustrated the principles of the invention in preferred embodiments thereof, it should be apparent that the invention can be modified in arrangement and detail without departing from such principles. We therefore claim all modifications and variation coming within the spirit and scope of the following claims.

What is claimed is:

1. A method for forming a semiconductor device, the method comprising:
   forming adjacent conductive patterns overlying a semiconductor substrate, the conductive patterns each having a conductive line and a capping layer;
   forming a first spacer formation layer between the adjacent conductive patterns, the first spacer formation layer formed between the top surface of the capping layer and the bottom surface of the conductive line;
   conformally forming a second spacer formation layer on the conductive patterns;
   forming a first interlayer insulating layer on the conformal second spacer formation layer including un-etched top flat portions;
   forming an opening, in the first interlayer insulating layer, which extends to a portion of the first spacer formation layer; and
   etching the portion of the first spacer formation layer, using the second spacer formation layer including the un-etched top flat portions as an etch mask, to form a single-layer spacer on sidewalls of the conductive patterns.

2. The method of claim 1, wherein the first spacer formation layer is substantially below the top surface of the capping layer.

3. The method of claim 1, wherein the top surface of the first spacer formation layer is approximately intermediate between the top surface of the capping layer and the bottom surface of the conductive line.

4. The method of claim 1, wherein forming the first spacer formation layer comprises depositing a dielectric layer overlying the conductive patterns and adjusting the height of the dielectric layer.

5. The method of claim 4, wherein the adjusting the height of the dielectric layer comprises wet etching the dielectric layer.

6. The method of claim 1, wherein conformally forming a second spacer formation layer comprises forming the second spacer formation layer on the first spacer formation layer.

7. The method of claim 1, wherein forming an opening comprises
exposing a portion of the second spacer formation layer; and
removing a portion of the exposed second spacer formation layer to expose a portion of the first spacer formation layer.

8. The method of claim 1, further comprising planarizing the first interlayer insulating layer before forming the opening.

9. The method of claim 8, wherein the planarized first interlayer insulating layer has an etch selectivity with respect to the second spacer formation layer.

10. The method of claim 1, wherein the second spacer formation layer has an etch selectivity with respect to the first spacer formation layer.

11. The method of claim 1, wherein etching the portion of the first spacer formation layer concurrently forms a contact hole that is self-aligned with the single-layer spaier between the adjacent conductive patterns.

12. The method of claim 11, further comprising sequentially forming second and third interlayer insulating layers on the semiconductor substrate before forming the conductive patterns, the second insulating layer having a contact pad formed therein.

13. The method of claim 12, wherein the contact hole also extends through the third interlayer insulating layer to expose a portion of the contact pad.

14. The method of claim 12, further comprising forming a contact plug within the contact hole electrically connected to the contact pad.

15. The method of claim 1, wherein the opening is for line type node contact.

16. The method of claim 1, wherein the single-layer spacer comprises an upper portion and a lower portion, the upper portion comprising a different material from the lower portion.

17. The method of claim 16, wherein all of the upper portion is vertically stacked above the lower portion.

18. The method of claim 1, wherein the second spacer formation layer has a portion un-etched and substantially flat during the formation of the single-layer spacer.

19. A method of forming a semiconductor memory device, the method comprising:
forming a first interlayer insulating layer on a semiconductor substrate;
forming a contact pad in the first interlayer insulating layer;
forming a second interlayer insulating layer on the first interlayer insulating layer;
forming adjacent bit line stacks on the second interlayer insulating layer, the bit line stacks each comprising a bit line and a capping layer;
forming a first spacer formation layer on the second interlayer insulating layer between the adjacent bit line stacks, the top surface of the first spacer formation layer substantially below the top surface of the bit line stacks;
conformally forming a second spacer formation layer on the first spacer formation layer and on the bit line stacks;
without etching the second spacer formation layer, forming a third interlayer insulating layer on the conformal second spacer formation layer including un-etched top flat portions over a top surface of the capping layer;
forming an opening in the third interlayer insulating layer to expose a top flat surface of the second spacer formation layer;
removing a portion of the second spacer formation layer to expose a portion of the first spacer formation layer; and
concurrently forming a single-layer spacer on sidewalls of the bit line stacks, and a contact hole self-aligned with the single-layer spacer between the adjacent bit line stacks using the second spacer formation layer including the un-etched top flat portions as an etching mask.

20. The method of claim 19, wherein the opening is formed between the adjacent bit line stacks, the opening being self-aligned with the second spacer formation layer.

21. The method of claim 19, wherein currently forming a single-layer spacer and a contact hole comprises etching the exposed portion of the first spacer formation layer and the second interlayer insulating layer, using the second spacer formation layer as an etch mask.

22. A semiconductor device formed by the process comprising:
forming adjacent conductive patterns overlying a semiconductor substrate, the conductive patterns each having a conductive line and a capping layer;
forming a first spacer formation layer between the adjacent conductive patterns, the first spacer formation layer formed between the top surface of the capping layer and the bottom surface of the conductive line;
conformally forming a second spacer formation layer on the conductive patterns;
forming a first interlayer insulating layer on the conformal second spacer formation layer including un-etched top flat portions;
forming an opening, in the first interlayer insulating layer, which extends to a portion of the first spacer formation layer; and
etching the portion of the first spacer formation layer, using the second spacer formation layer including the un-etched top flat portions as an etch mask, to form a single-layer spacer on sidewalls of the conductive patterns.

23. The device of claim 22, wherein forming an opening comprises:
exposing a portion of the second spacer formation layer; and
removing a portion of the exposed second spacer formation layer to expose a portion of the first spacer formation layer.

24. A method for forming a semiconductor device, the method comprising:
forming adjacent conductive patterns overlying a semiconductor substrate, the conductive patterns each having a conductive line and a capping layer;
forming a first spacer formation layer between the adjacent conductive patterns, the first spacer formation layer formed between the top surface of the capping layer and the bottom surface of the conductive line;
conformally forming a second spacer formation layer on the conductive patterns;

forming a first interlayer insulating layer on the second spacer formation layer and leaving at least a portion of the second spacer formation layer on atop surface of the capping layer;

forming an opening Through the first interlayer insulating layer to expose an upper flat surface of the second spacer formation layer using the second spacer formation layer as an etching stopper;

expanding the opening to expose a portion of the first spacer formation layer; and etching the portion of the first spacer formation layer, using the second spacer formation layer as an etch mask, to form a single-layer spacer on sidewalls of the conductive patterns.

* * * * *

UNITED STATES PATENT AND TRADEMARK OFFICE
CERTIFICATE OF CORRECTION

| | | |
|---|---|---|
| PATENT NO. | : 7,056,828 B2 | Page 1 of 1 |
| APPLICATION NO. | : 10/404951 | |
| DATED | : June 6, 2006 | |
| INVENTOR(S) | : Tae-Young Chung et al. | |

It is certified that error appears in the above-identified patent and that said Letters Patent is hereby corrected as shown below:

Column 7, line 29, the word "spaier" should read -- spacer --;
Column 9, line 3, the word "atop" should read -- a top --;
Column 9, line 5, the word "Through" should read -- through --.

Signed and Sealed this

Eighteenth Day of August, 2009

David J. Kappos
*Director of the United States Patent and Trademark Office*